United States Patent
Lee et al.

(10) Patent No.: US 9,941,247 B2
(45) Date of Patent: Apr. 10, 2018

(54) STACK SEMICONDUCTOR DEVICE AND MEMORY DEVICE WITH DRIVING CIRCUITS CONNECTED TO THROUGH-SILICON-VIAS (TSV) IN DIFFERENT SUBSTRATES IN A STAGGERED MANNER

(71) Applicant: SAMSUNG ELECTRONICS CO., LTD., Suwon-si, Gyeonggi-Do (KR)

(72) Inventors: Hae-Suk Lee, Seongnam-si (KR);
Kyo-Min Sohn, Yongin-si (KR);
Ho-Young Song, Hwaseong-si (KR);
Sang-Hoon Shin, Suwon-si (KR);
Han-Vit Jung, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/790,451

(22) Filed: Jul. 2, 2015

(65) Prior Publication Data

US 2016/0133312 A1  May 12, 2016

(30) Foreign Application Priority Data

Nov. 11, 2014  (KR) .................. 10-2014-0155925

(51) Int. Cl.
*G11C 11/4093* (2006.01)
*H01L 25/065* (2006.01)
*G11C 7/10* (2006.01)

(52) U.S. Cl.
CPC ........ *H01L 25/0657* (2013.01); *G11C 7/1066* (2013.01); *G11C 7/1069* (2013.01); *H01L 2924/0002* (2013.01)

(58) Field of Classification Search
CPC .... G11C 5/04; G11C 5/02; G11C 5/06; G11C 11/4093; G11C 11/4094; G11C 11/4096; H01L 21/76898; H01L 25/0657
See application file for complete search history.

(56) References Cited

U.S. PATENT DOCUMENTS

| | | | |
|---|---|---|---|
| 7,999,367 | B2 | 8/2011 | Kang et al. |
| 8,148,814 | B2 | 4/2012 | Furuta et al. |
| 8,384,432 | B2 | 2/2013 | Kondo |
| 8,391,087 | B2 | 3/2013 | Hirobe |
| 8,601,188 | B2 | 12/2013 | Kondo et al. |
| 8,779,577 | B2 * | 7/2014 | Ossimitz ............. H01L 24/85 257/203 |
| 9,214,449 | B2 * | 12/2015 | Keeth ................ G11C 5/02 |
| 2012/0134193 | A1 | 5/2012 | Ide |
| 2013/0049223 | A1 | 2/2013 | Nomoto et al. |

(Continued)

FOREIGN PATENT DOCUMENTS

JP        5416211        11/2013

*Primary Examiner* — Andrew Q Tran
(74) *Attorney, Agent, or Firm* — Volentine & Whitt, PLLC

(57) ABSTRACT

A memory device including a stack semiconductor device including; an upper substrate vertically stacked on a lower substrate, the upper substrate including N upper through-silicon vias (UTSV) and upper driving circuits, and the lower substrate including N lower through-silicon vias (LTSV) and lower driving circuits, wherein each one of the upper driving circuits is stagger-connected between a Kth UTSV and a (K+1)th LTSV, where 'N' is a natural number greater than 1, and 'K' is a natural number ranging from 1 to (N−1).

20 Claims, 18 Drawing Sheets

(56) References Cited

U.S. PATENT DOCUMENTS

| | | |
|---|---|---|
| 2013/0093099 A1 | 4/2013 | Shin et al. |
| 2013/0119542 A1 | 5/2013 | Oh |
| 2013/0214389 A1* | 8/2013 | Lee .................... G11C 29/702 |
| | | 257/621 |
| 2013/0258788 A1 | 10/2013 | Ide et al. |

* cited by examiner

STACK SEMICONDUCTOR DEVICE AND MEMORY DEVICE WITH DRIVING CIRCUITS CONNECTED TO THROUGH-SILICON-VIAS (TSV) IN DIFFERENT SUBSTRATES IN A STAGGERED MANNER

CROSS-REFERENCE TO RELATED APPLICATION

This application claims priority under 35 USC § 119 to Korean Patent Application No. 10-2014-0155925 filed on Nov. 11, 2014, the subject matter of which is hereby incorporated by reference.

BACKGROUND

The inventive concept relates generally to memory devices, and more particularly to stacked semiconductor devices.

Market demands continue to drive research and development to provide semiconductor memory devices that provide data at faster and faster speeds.

SUMMARY

Embodiments of the inventive concept provide a stack semiconductor device that is capable of dividing a signal input/output load by use of multiple through-silicon-via paths and driving circuits arranged across a plurality of vertically stacked substrates.

In one embodiment, the inventive concept provides a stack semiconductor device including; an upper substrate vertically stacked on a lower substrate, the upper substrate including N upper through-silicon vias (UTSV) and upper driving circuits, and the lower substrate including N lower through-silicon vias (LTSV) and lower driving circuits, wherein each one of the upper driving circuits is stagger-connected between a Kth UTSV and a (K+1)th LTSV, where 'N' is a natural number greater than 1, and 'K' is a natural number ranging from 1 to (N−1).

In another embodiment, the inventive concept provides a memory device including; a memory cell array configured to store data, and a stack semiconductor device configured to transfer at least one of write data to be written to the memory cell array and read data read from the memory cell array, wherein the stack semiconductor device includes an upper substrate vertically stacked on a lower substrate, the upper substrate including N upper through-silicon vias (UTSV) and upper driving circuits, and the lower substrate including N lower through-silicon vias (LTSV) and lower driving circuits, wherein each one of the upper driving circuits is stagger-connected between a Kth UTSV and a (K+1)th LTSV, where 'N' is a natural number greater than 1, and 'K' is a natural number ranging from 1 to (N−1).

In another embodiment, the inventive concept provides a memory device including; a memory cell array that provides read data in response to a read command received from a memory controller, and a stack semiconductor device that transfers the read data as read data signals through a plurality of output driving circuits disposed in a plurality of substrates, wherein the read data signals are synchronously provided by the stack semiconductor device in response to a reference signal generated in response to the read command.

BRIEF DESCRIPTION OF THE DRAWINGS

Illustrative, non-limiting embodiments will be more clearly understood from the following detailed description taken in conjunction with the accompanying drawings.

DETAILED DESCRIPTION

Figure 1:
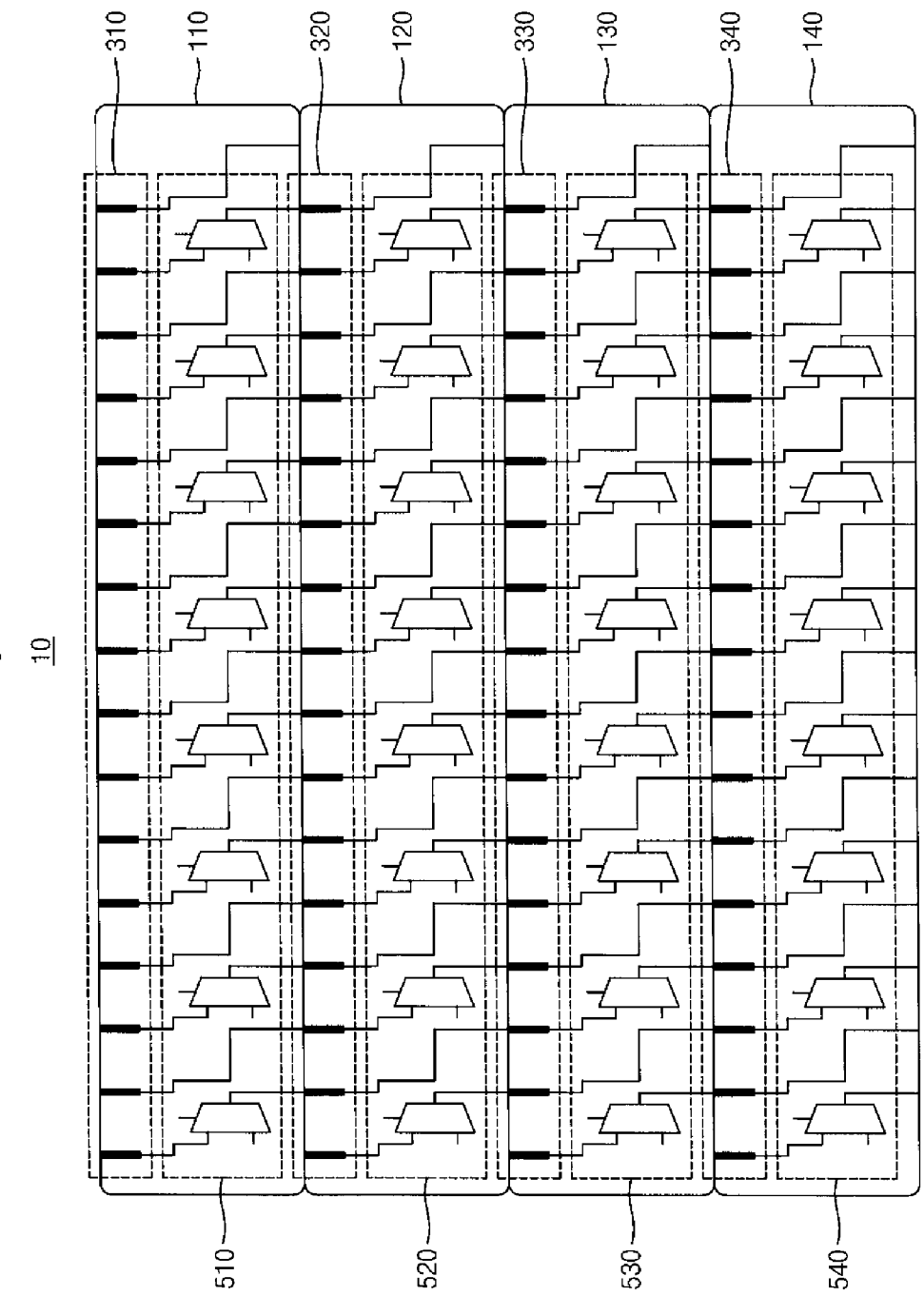
FIG. 1 is a diagram illustrating a stack semiconductor device according to embodiments.

Certain embodiments of the inventive concept will now be described in some additional detail with reference to the accompanying drawings. The inventive concept may, however, be embodied in many different forms and should not be construed as limited to only the illustrated embodiments. Rather, these embodiments are provided so that this disclosure will be thorough and complete, and will fully convey the scope of the present inventive concept to those skilled in the art. In the drawings, the sizes and relative sizes of layers and regions may be exaggerated for clarity. Throughout the written description and drawings, like reference numbers and labels are used to denote like or similar elements.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Herein, relative geometric or spatial terms such as "vertical/horizontal", "upper/lower", "above/below", etc. are used in an arbitrary descriptive context to more clearly describe possible relationships between two or more features or elements of the illustrated embodiments. These terms are not to be strictly interrupted as ascribing a mandatory orientation to illustrated embodiments.

Figure 2:
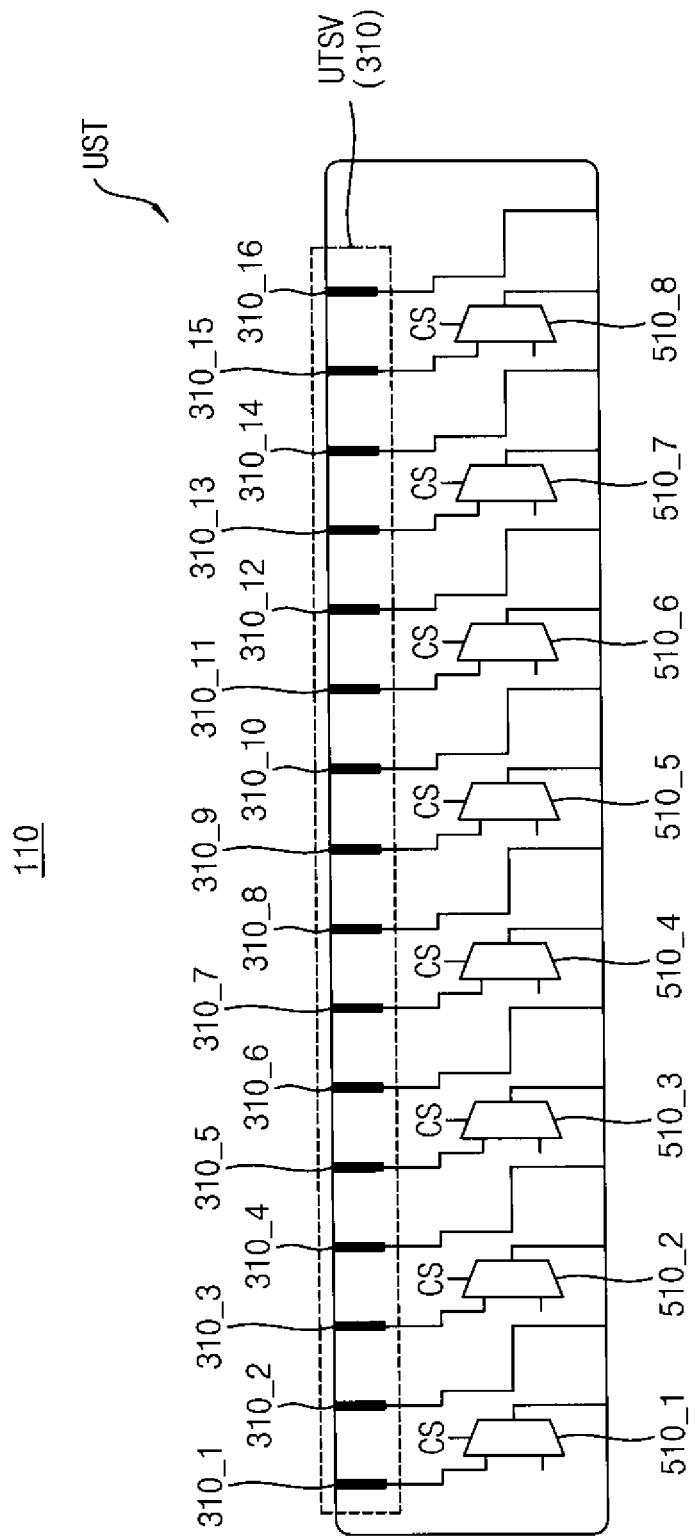
FIG. 2 is a diagram illustrating an example of an upper substrate included in the stack semiconductor device of FIG. 1.

Figure (FIG.) 1 is a cross-sectional diagram illustrating a stack semiconductor device 10 according to an embodiment of the inventive concept. FIG. 2 is a cross-sectional diagram further illustrating the upper substrate 110 of the stack semiconductor device 10 of FIG. 1, and FIG. 3 is a cross-sectional diagram illustrating a second (lower) substrate 120 of the stack semiconductor device 10 of FIG. 1.

Figure 3:
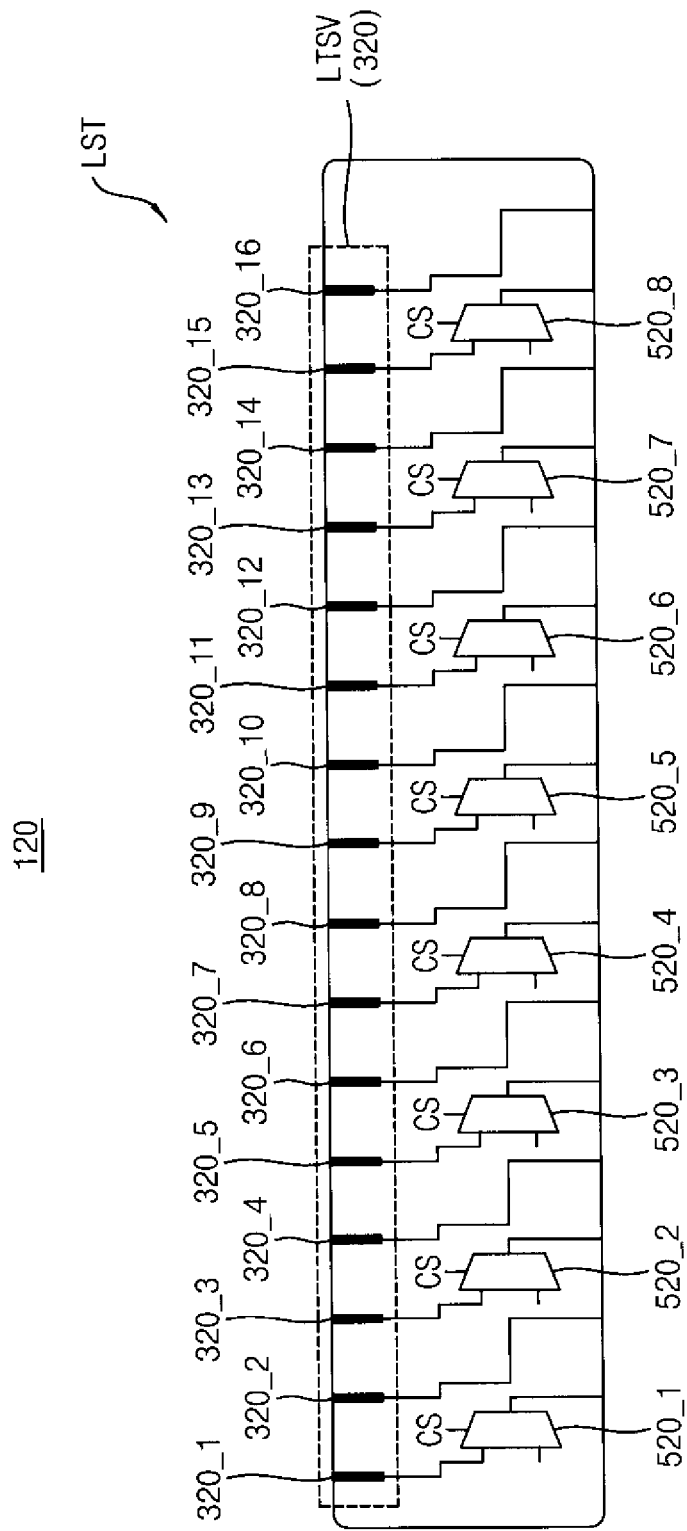
FIG. 3 is a diagram illustrating an example of a lower substrate included in the stack semiconductor device of FIG. 1.

Referring to FIGS. 1, 2 and 3, the stack semiconductor device 10 includes a plurality of vertically stacked substrates 110, 120, 130 and 140 respectively including driving circuits 510, 520, 530 and 540, as well as corresponding through-silicon-vias 310, 320, 330 and 340. The respective through-silicon-vias 310, 320, 330 and 340 are disposed in an upper portion of substrates 110, 120, 130 and 140.

The number of driving circuits and the number of through-silicon-vias included in each vertically stacked substrate is a matter of design choice. However, in FIGS. 1, 2 and 3, the first substrate 110 includes first to sixteenth through-silicon-vias 310_1 to 310_16. The second substrate 120 includes first to sixteenth through-silicon-vias 320_1 to 320_16; the third substrate 130 includes first to sixteenth through-silicon-vias 330; and the fourth substrate includes first to sixteenth through-silicon-vias 340.

Each driving circuit in each one of the plurality of driving circuits 510, 520, 530 and 540 is connected according to a staggered connection scheme wherein each driving circuit is connected between a Kth through-silicon-via of an upper through-silicon-vias (UTSV) and a (K+1)th through-silicon-via of lower through-silicon-vias (LTSV), where 'K' is a natural number. Here, each upper through-silicon-vias UTSV is disposed in a substrate above the driving circuit and each lower through-silicon-vias LTSV is disposed in a substrate below the driving circuit. Thus, as between the first substrate 110 and second substrate 120, for example, the first substrate 110 is considered an upper substrate UST, 'above' and the second substrate 120 is considered a lower substrate LST, 'below'. According to this nomenclature, and assuming that K=1, the driving circuit 510_1 is connected between a first through-silicon-via 310_1 included in the first substrate 110 and a second through-silicon-via 320_2 included in the second substrate 120; the driving circuit 520_1 is connected between a first through-silicon-via 320_1 included in the second substrate 120 and a second through-silicon-via 330_2 included in the third substrate 130, etc.

In this manner, each driving circuit 510, 520, 530 and 540 may be connected between a respective upper through-silicon-vias UTSV and a respective lower through-silicon-vias LTSV. In the illustrated embodiment of FIG. 1, each substrate includes first to eighth driving circuits (e.g., 510_1 to 510_8; 520_1 to 520_8, etc.). But like the choice of a number of through-silicon-vias, this is merely an arbitrarily selected example presented for purposes of description.

With the configuration illustrated in FIG. 1, the stack semiconductor device 10 may divide the signal driving load across a number of through-silicon-via paths by connecting respective driving circuits between an upper through-silicon-via UTSV and a lower through-silicon-via LTSV.

Figure 4:
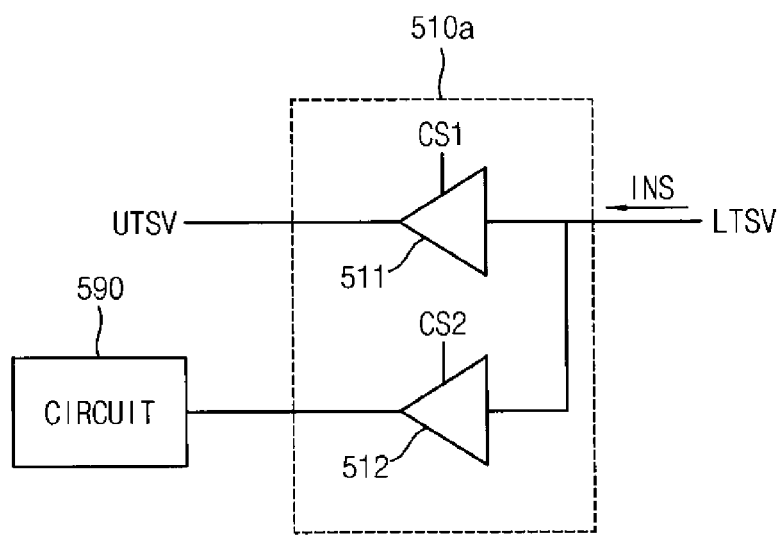
FIG. 4 is a diagram illustrating an example of a driving circuit included in the stack semiconductor device of FIG. 1.

FIG. 4 is a diagram illustrating a driving circuit that may be included in the stack semiconductor device 10 of FIG. 1.

Referring FIG. 4, each driving circuit (510a) in the various pluralities of driving circuits 510, 520, 530 and 540 may include a first input buffer 511 and a second input buffer 512. The first input buffer 511 is controlled by a first control signal CS1, and the second input buffer 512 is controlled by a second control signal CS2, where the first and second control signals CS1 and CS2 are part of a larger (e.g., a multiplexed or multi-signal component) control signal CS.

Figure 7:
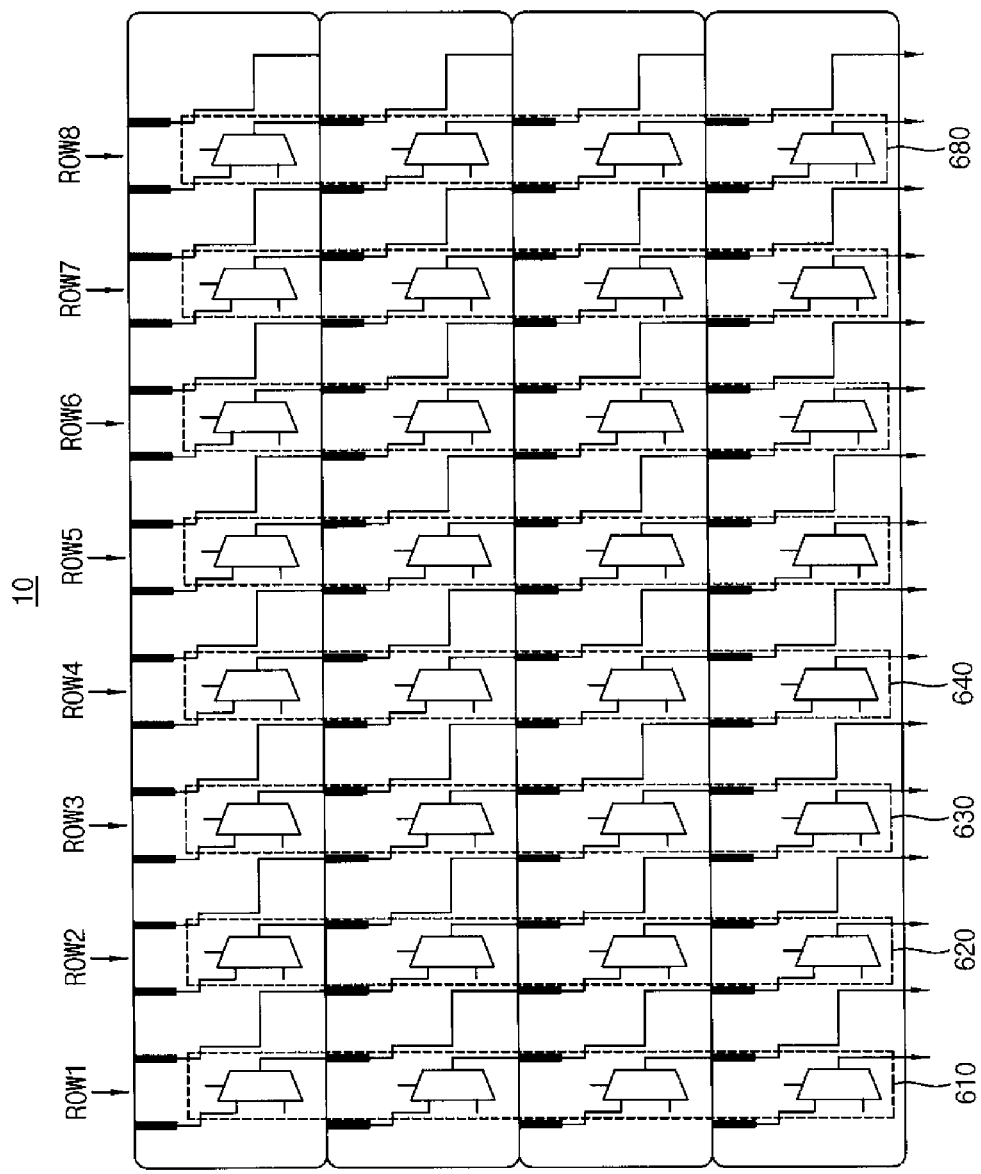
FIG. 7 is a diagram for describing an operation of a driving circuit included in the stack semiconductor device of FIG. 1.

The operating mode of the stack semiconductor device 10 may be changed based on a stack number SN, where the stack number SN is equal to the number of semiconductor substrates arranged in the stack semiconductor device 10. Driving circuits 510, 520, 530 and 540 may be controlled in their respective operation (or operating mode) by the control signal CS. As illustrated in FIG. 7, in a case where the driving circuits 510, 520, 530 and 540 are respectively connected between an UTSV and a LTSV like the structure shown in FIG. 1, a "row group" of driving circuits from the pluralities of driving circuits 510, 520, 530 and 540 that are disposed in a vertical row traversing the stacked substrates may be commonly controlled by the same one or more control signal(s) CS. For example, in a case where driving circuits 510, 520, 530 and 540 are stagger-connected between an UTSV ('K') and a LTSV ('K+1') and the stack number SN is 4, each of the driving circuits in a first row group 610 (i.e., driving circuits vertically arranged in a first column ROW1) may be commonly controlled to transfer a signal (e.g., data) between corresponding LTSV and UTSV in response to at least one control signal CS.

Referring again to the illustrated example of FIG. 4, an input signal (INS) may be selectively communicated from an LTSV to one or both of an UTSV and a circuit 590 in response to the respective states (e.g., enable/disable) of the first control signal CS1 and second control signal CS2. That is, an input signal may be received at the LTSV associated with the driving circuit 510a, and then stored (or latched) in each one of a first input buffer 511 and a second input buffer 512. Here, it is assumed that the driving circuit 510a is included in the first row group 610 of FIG. 7, but driving circuit 510a might alternately be included in any one of the first through eighth row groups. Once the input signal has been communicated to the first and second input buffers 511, 512—the respective enable/disable state of first control signal CS1 and second control signal CS2 determine whether the input signals is passed to the UTSV associated with the driving circuit 510a, and/or the circuit 590.

Figure 5:
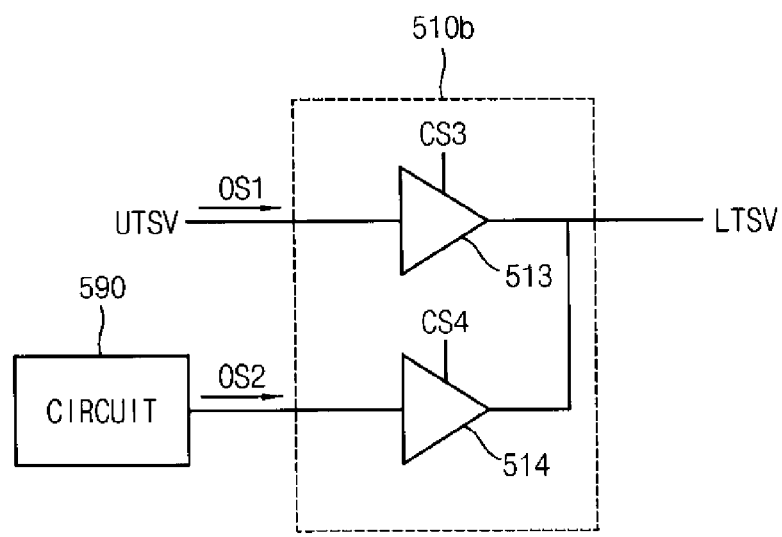
FIG. 5 is a diagram illustrating another example of a driving circuit included in the stack semiconductor device of FIG. 1.

FIG. 5 is a diagram illustrating another driving circuit (510b) that may be included in the stack semiconductor device 10 of FIG. 1.

Referring to FIG. 5, the illustrated example of driving circuit 510b is structurally similar to that of driving circuit 410a of FIG. 4. However, driving circuit 510b is operated as an output signal (OS) driver rather than an input signal (INS) driver. Accordingly, one or both of a first output signal (OS1) from the UTSV associated with the driving circuit 510b and a second output signal (OS2) from the circuit 590 are respectively received and stored by a first output buffer 513 and a second output buffer 514. Then, in response to the state (enable/disable) of a third control signal (CS3) and a fourth control signal (CS4), respectively, the first output buffer 513 and/or the fourth output buffer 514 will pass the first output signal OS1 and/or the second output signal OS2 to the LTSV associated with the driving circuit 510b.

Here again, it is assumed that the driving circuit 510b is included in the first row group 610 of FIG. 7, but driving circuit 510b might alternately be included in any one of the first through eighth row groups.

Thus, each one of the driving circuits included in the various pluralities of driving circuits 510, 520, 530 and 540 illustrated in FIG. 1 may include first and second input buffers 511, 512, and first and second output buffers 513, 514. Alternately each one of the driving circuits included in the various pluralities of driving circuits 510, 520, 530 and 540 illustrated in FIG. 1 may include first and second input/output (I/O) buffers capable of two-way data communication.

Figure 6:
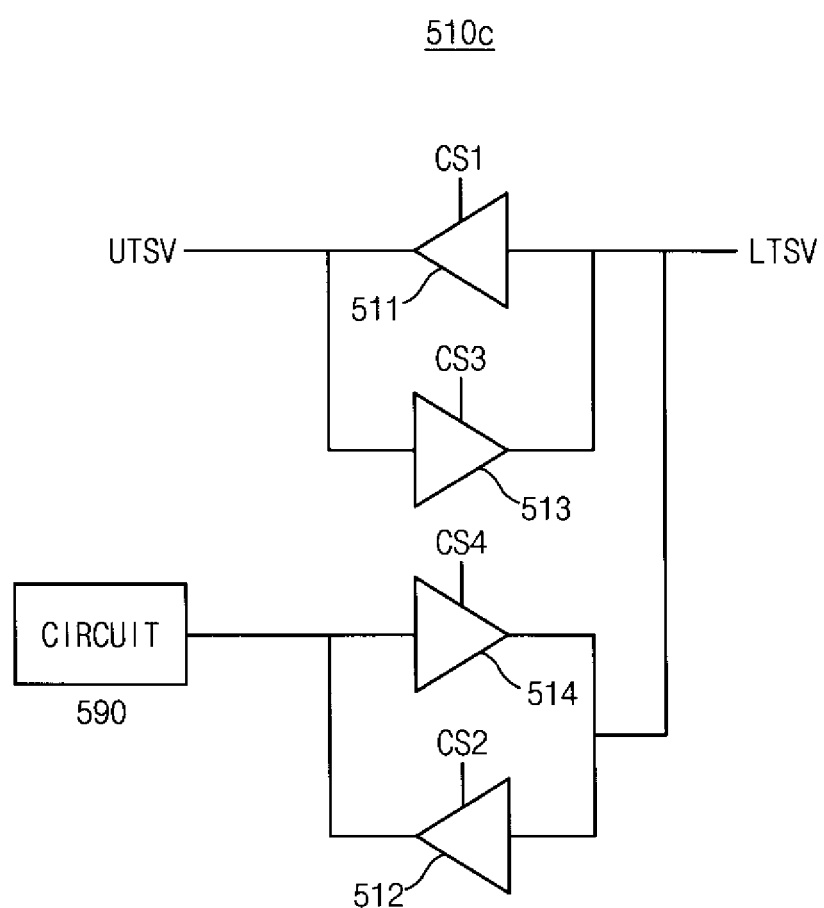
FIG. 6 is a diagram illustrating still another example of a driving circuit included in the stack semiconductor device of FIG. 1.

FIG. 6 is a diagram illustrating still another driving circuit (510c) that may be included in the stack semiconductor device 10 of FIG. 1.

Referring to FIG. 6, driving circuit 510c is assumed to include dual I/O buffers operatively including first input and first output buffer 511, 513, and second input and second output buffers 512, 514, respectively controlled by the first, third, second and fourth control signals CS1, CS3, CS2 and CS4. Here, the dual I/O buffers of the driving circuit 510c—disposed between the LTSV and UTSV/circuit 590— provide the same functionality described above in relation to FIGS. 4 and 5.

Here, the driving circuit 510c may be included in a row group of a stack semiconductor device according to an embodiment of the inventive concept, although unlike the example illustrated in FIG. 7, each driving circuit 510c in a row group requires connectivity to four (4) control signals rather than just two (2).

Figure 8:
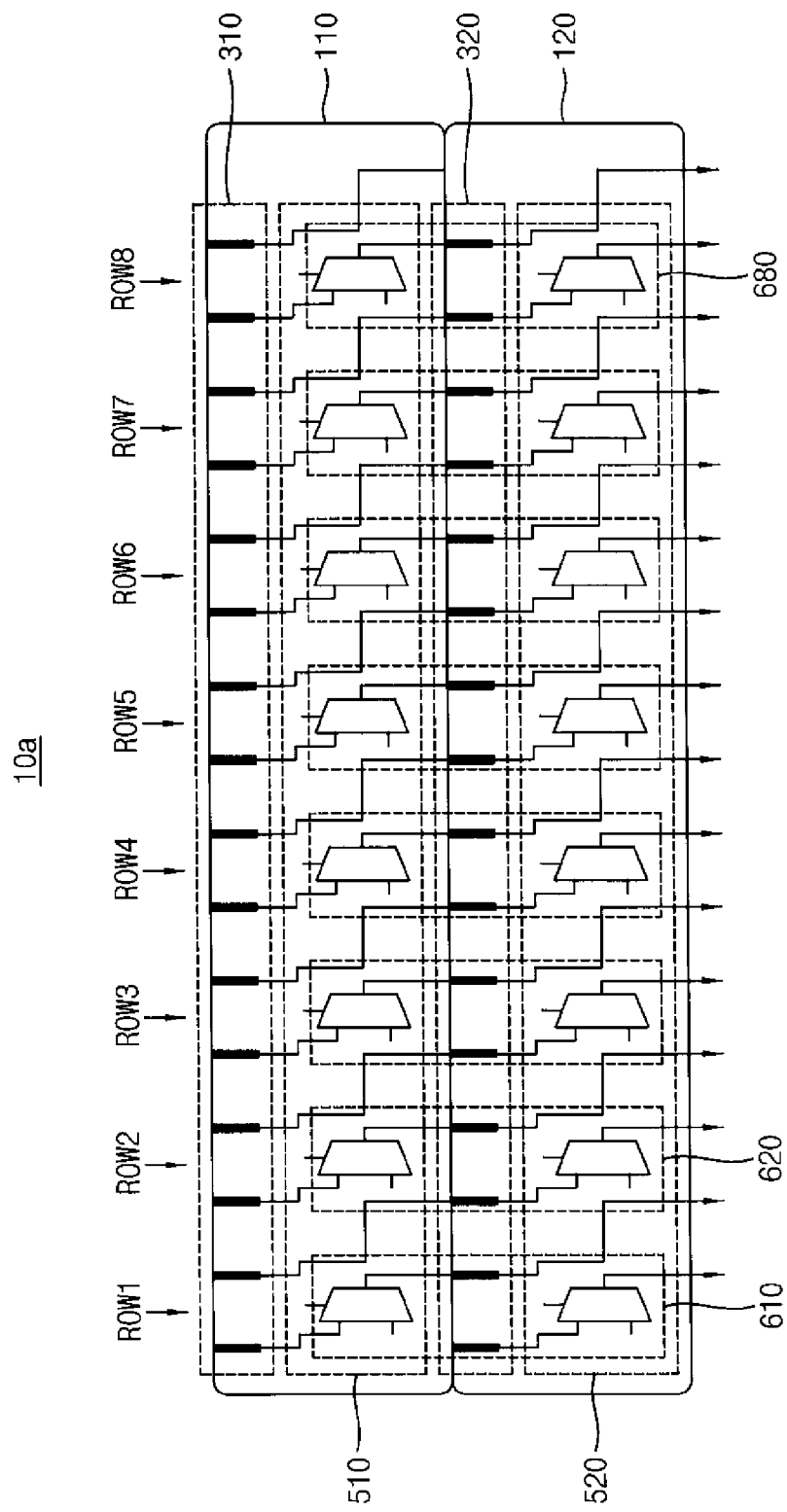
FIG. 8 is a diagram illustrating a stack semiconductor device according to an embodiment in case a stack number is 2.

FIG. 8 is a diagram illustrating a stack semiconductor device (10a) according to an embodiment of the inventive concept, given a stack number SN of 2.

Referring to FIGS. 6 and 8, the stack semiconductor device 10a includes first and second stacked substrates 110 and 120 respectively including through-silicon-vias 310 and 320 and driving circuits 510 and 520. Again, it is assumed that each one of the driving circuits 510 and 520 is stagger-connected between a corresponding UTSV ('K') and a LTSV ('K+1') and arranged in lateral columns across each stacked substrate.

Any one of the particular driving circuits (510a, 510b and 510c) described in relation to FIGS. 4, 5 and 6 may be used in the stack semiconductor 10a of FIG. 8.

Figure 9:
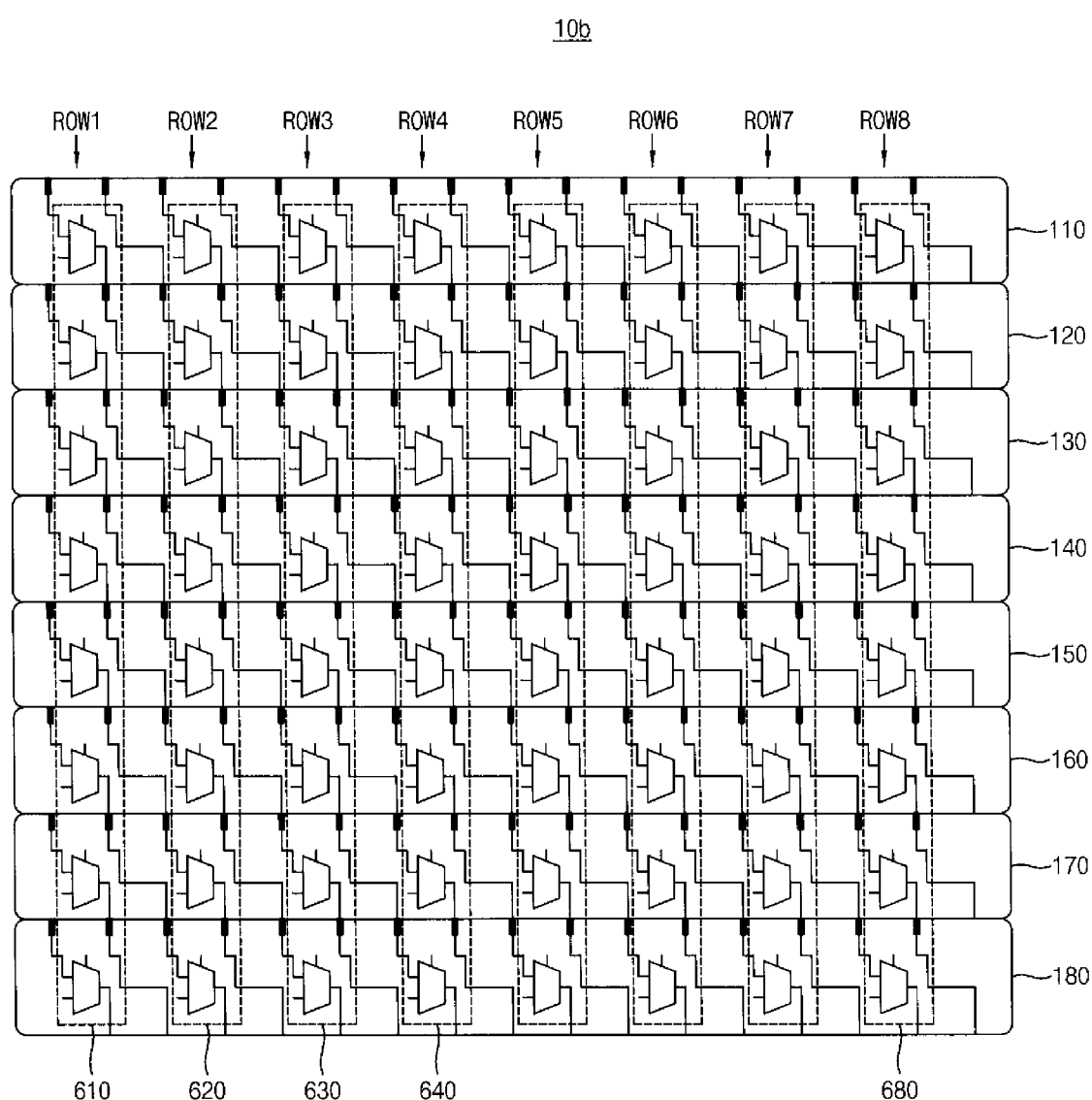
FIG. 9 is a diagram illustrating a stack semiconductor device according to an embodiment in case a stack number is 8.

FIG. 9 is a diagram illustrating a stack semiconductor device (10b) according to an embodiment of the inventive concept, given a stack number SN of 8. Hence, the stack semiconductor device 10b includes a plurality of substrates 110 to 180, through-silicon-vias 310 to 380 and of driving circuits 510 to 580.

Each driving circuit in the pluralities of driving circuits 510 to 580 is connected between an UTSV ('K') and a LTSV ('K+1'), where 'K' ranges from 1 to N. The driving circuits 510 to 580 arranged in lateral columns across the various substrates, and grouped in respective row groups (e.g., row groups 610 to 680) traversing the stacked substrates may be variously configured and controlled, per the description above in relation to FIGS. 4, 5 and 6.

In relation to the foregoing illustrated embodiments it should be noted that more than one row group of driving circuits may be controlled in response to a set of one or more control signals. For example, the first and second control signals CS1, CS2 described in relation to FIG. 4, the third and fourth control signals CS3, CS4 described in relation to FIG. 5, or the first, second, third and fourth control signals CS1, CS2, CS3 and CS4 described in relation to FIG. 6 may be variously applied to control one or more row group(s) of driving circuits (e.g., odd rows—ROW1, ROW3, ROW5 and ROW7, or even rows—ROW2, ROW4, ROW6, ROW8, or outer rows ROW1 and ROW8, or adjacent rows—ROW1/ROW2, ROW3/ROW4, ROW5/ROW6, AND ROW7/ROW8, etc.).

The foregoing embodiments have been variously described in the context of defined rows and columns, where columns have been assumed along an axis consistent with a lateral (or horizontal) direction for the primary side of the stacked substrates, and rows have been assumed across an axis orthogonal (or vertical) to this lateral axis. However, these definitions are merely arbitrary descriptive assumptions and the structural features and elements of a stack semiconductor device according to an embodiment of the inventive concept may be otherwise described and defined.

Figure 10:
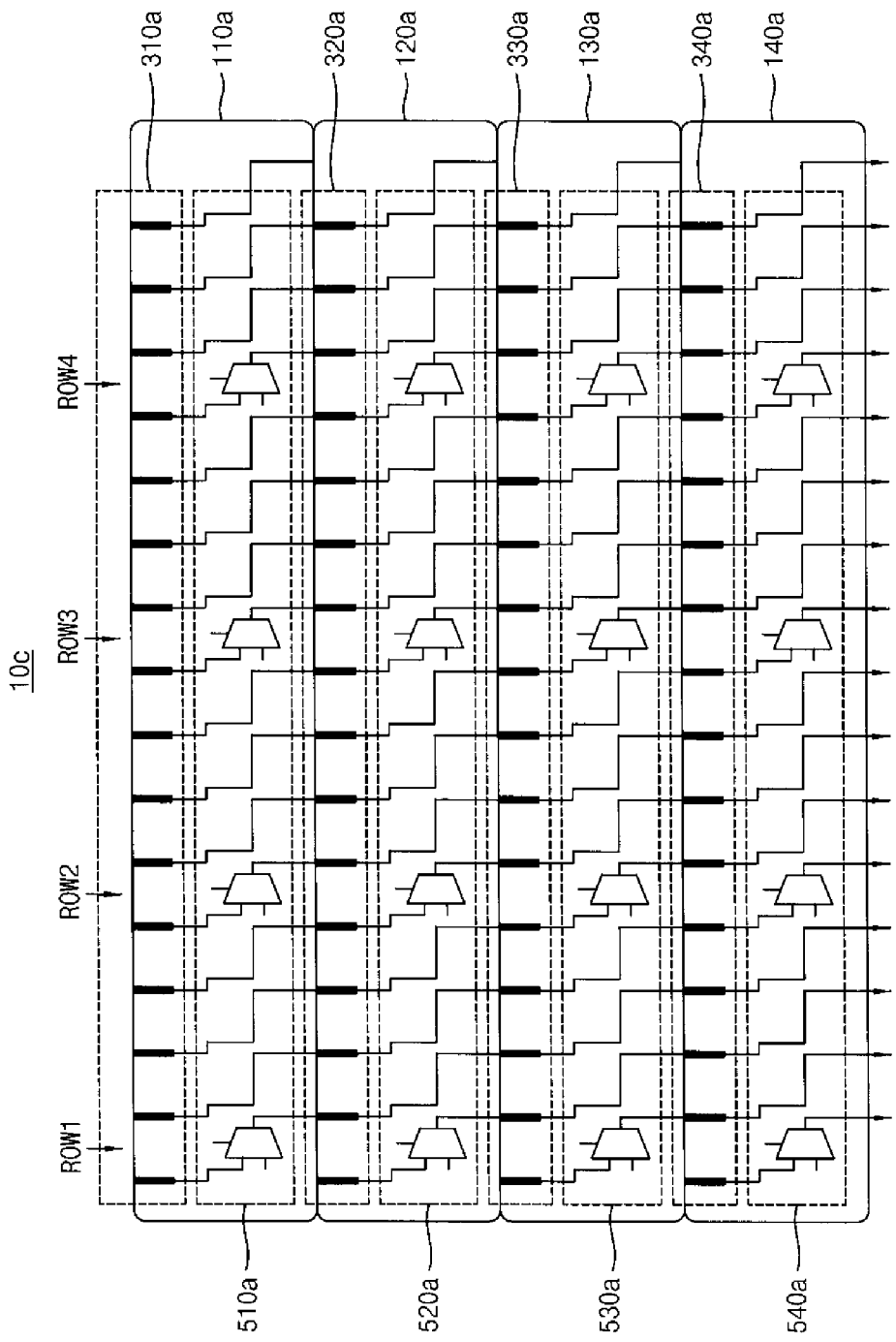
FIG. 10 is a diagram illustrating a stack semiconductor device according to an embodiment in case a driving circuit is placed every 4 through-silicon-vias and a stack number is 4.
Figure 11:
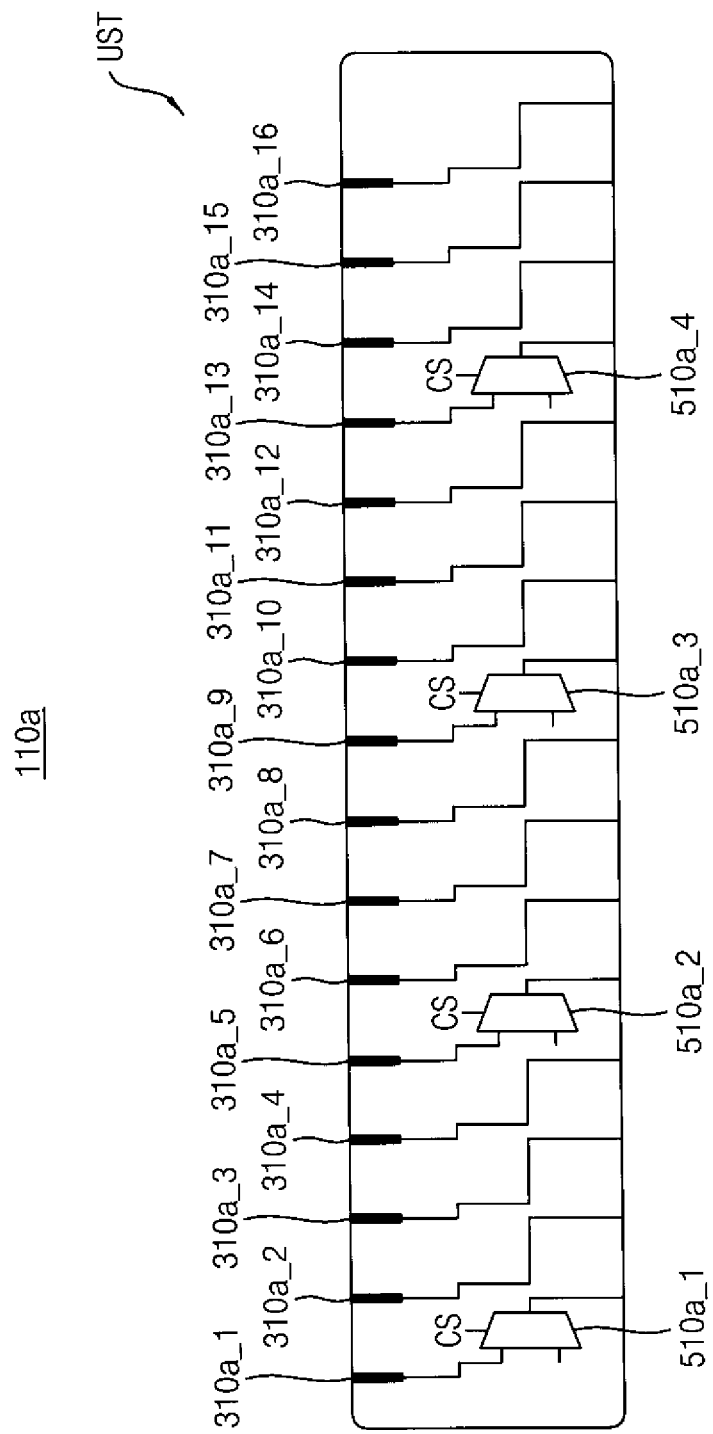
FIG. 11 is a diagram illustrating an example of an upper substrate included in the stack semiconductor device of FIG. 10.

FIG. 10 is a diagram illustrating a stack semiconductor device (10c) according to an embodiment of the inventive concept given a stack number of 4 and a driving circuit connection between an UTSV ('K') and a LTSV ('K+1'). However, instead of connecting a driving circuit to every other (i.e., only the odd numbered) UTSV of each substrate—as is assumed in the foregoing embodiments—in the embodiment illustrated in FIG. 10, a driving circuit is connected to every fourth UTSV. FIG. 11 is a diagram further illustrating the upper substrate of the stack semiconductor device 10c of FIG. 10, and FIG. 12 is a diagram further illustrating a lower substrate LST included in the stack semiconductor device 10c of FIG. 10.

Figure 12:
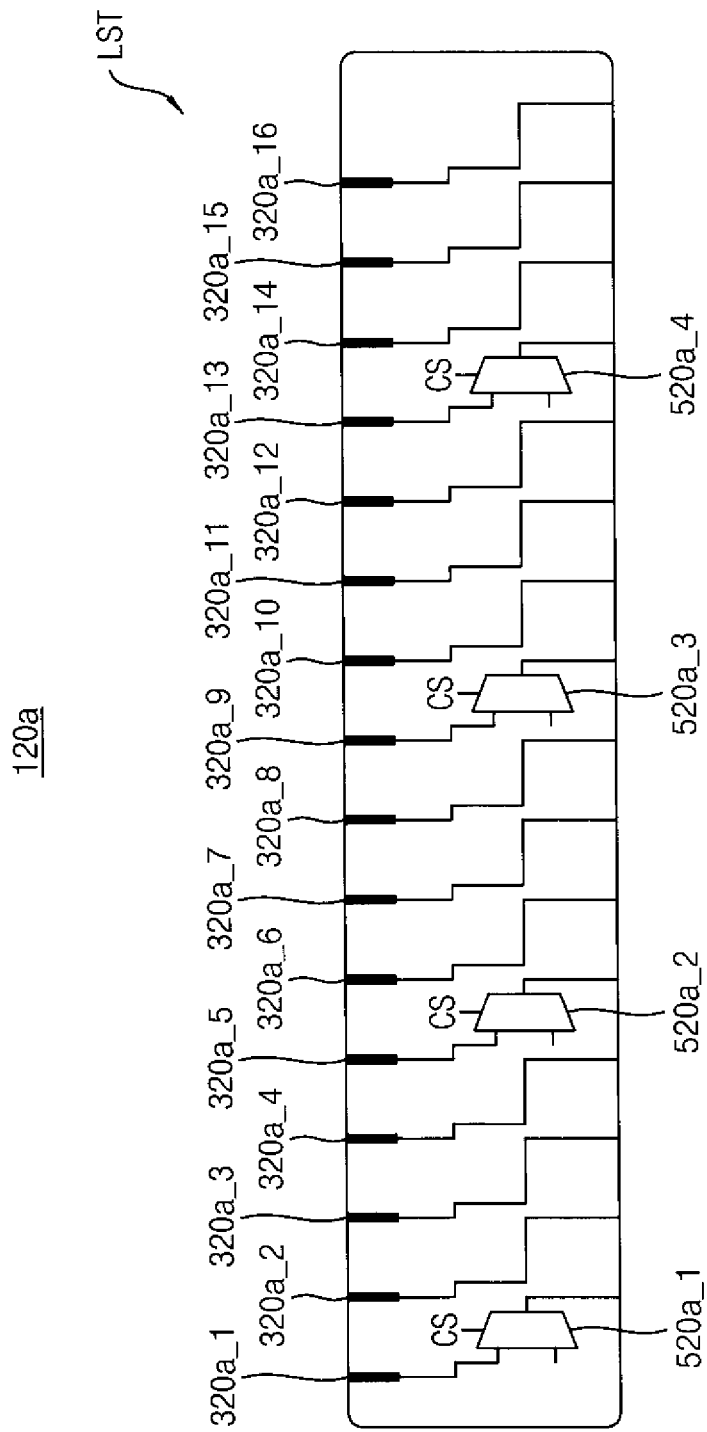
FIG. 12 is a diagram illustrating an example of a lower substrate included in the stack semiconductor device of FIG. 10.

Referring to FIGS. 10 to 12, the stack semiconductor device 10c includes a plurality of substrates 110a, 120a, 130a and 140a, through-silicon-vias 310a, 320a, 330a and 340a and driving circuits 510a, 520a, 530a and 540a. The plurality of through-silicon-vias 310a, 320a, 330a and 340a are placed in each of the plurality of substrates 110a, 120a, 130a and 140a. The plurality of driving circuits 510a, 520a, 530a and 540a are connected between a Kth through-silicon-via of upper through-silicon-vias UTSV and a (K+1) th through-silicon-via of lower through-silicon-vias LTSV. The UTSV are placed in an upper substrate UST of the plurality of substrates 110a, 120a, 130a and 140a, and the LTSV are placed in a lower substrate LST of the plurality of substrates 110a, 120a, 130a and 140a, such that each driving circuits 510a, 520a, 530a and 540a is connected between a UTSV and a LTSV.

As before the respective driving circuits 510a, 520a, 530a and 540a may be configured and controlled in their operation according to one or more of the examples described in relation to FIGS. 4, 5 and 6. And as before, defined row groups (e.g., ROW1 to ROW4) may be selectively controlled on an individual basis or in various combinations. In this regard a row group of driving circuits may be defined as an "input row group" including only input driving circuits (e.g., 511, 512 of FIG. 4), as an "output row group" including only output driving circuits (e.g., 513 and 514 of FIG. 5), or as an "input/output (I/O) row group" including both input and output driving circuits (e.g., 511/513 and 512/514 of FIG. 6).

Figure 13:
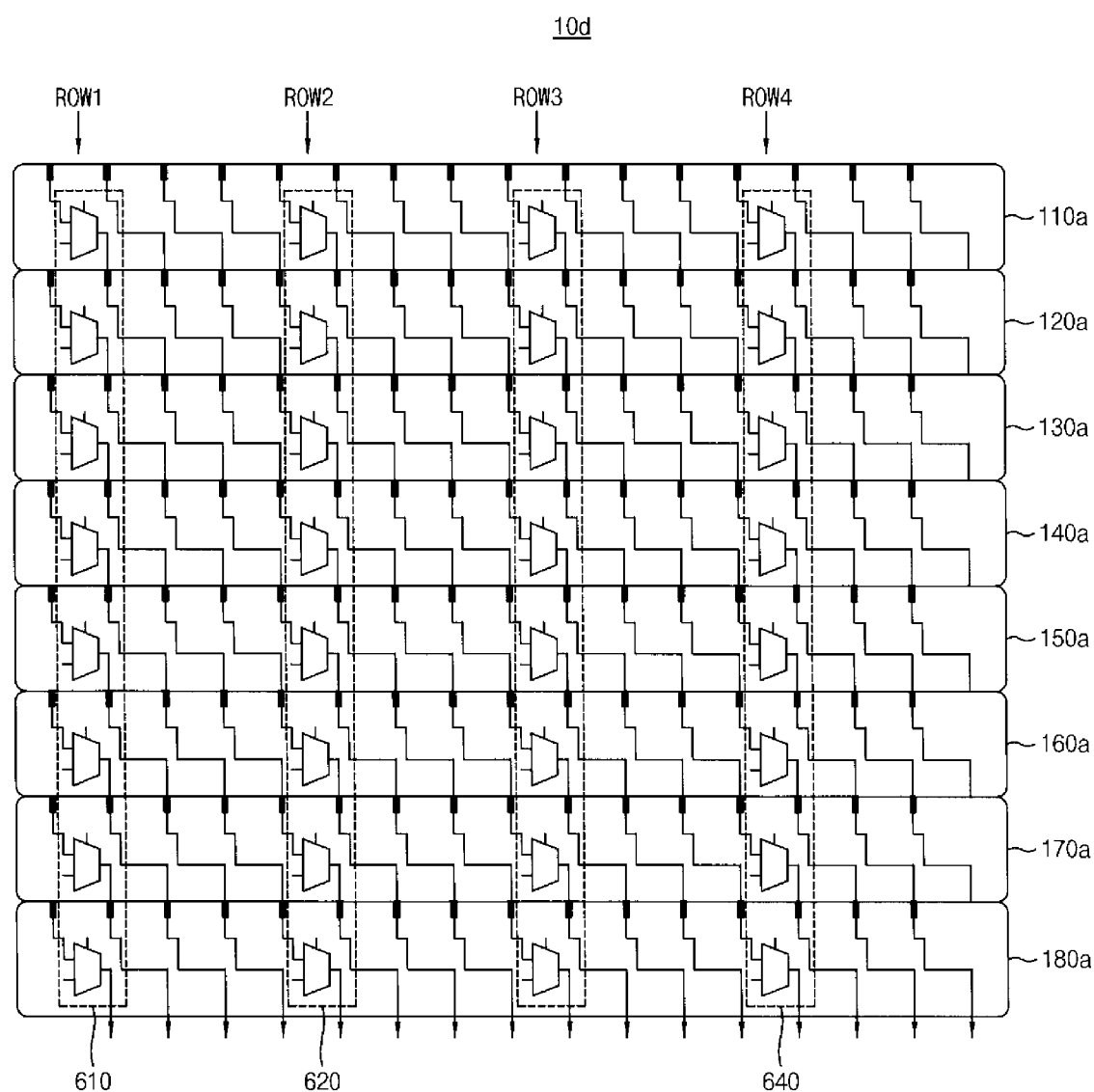
FIG. 13 is a diagram illustrating a stack semiconductor device according to an embodiment in case a driving circuit is placed every 4 through-silicon-vias and a stack number is 8.

FIG. 13 is a diagram illustrating a stack semiconductor device (10d) according to another embodiment of the inventive concept given a stack number of 8 and the same driving circuit connection configuration as described in relation to FIGS. 10, 11 and 12.

Here, respective row groups (ROW1 to ROW4) extend vertically through eight (8) substrates (110a to 180a) and the constituent driving circuits of each substrate are separated one from the other by connection to every other $4^{th}$ UTSV. Such an arrangement reduces inter-row noise.

Figure 14:
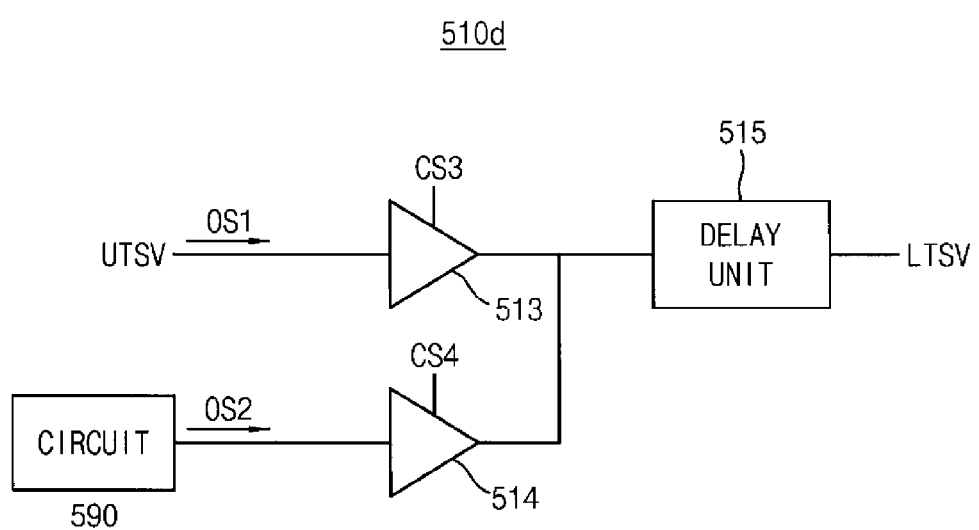
FIG. 14 is a diagram illustrating still another example of a driving circuit included in the stack semiconductor device of FIG. 1.

FIG. 14 is a diagram illustrating still another driving circuit (510d) that may be included in a stack semiconductor device according to an embodiment of the inventive concept.

The driving circuit 510d may be used in various pluralities of driving circuits (e.g., 510, 520, 530 and 540) previously described. In general structure, the driving circuit 510d is similar to the output driving circuit 510b of FIG. 5, except that a delay unit 515 is additionally provided between the LTSV associated with the driving circuit 510d and the remaining elements. More particularly, the delay unit 515 may receive one or both of the first and second output signals (OS1, OS2) from the first output buffer 513 and second output buffer 514 in response to the first and second control signals, respectively. Here, the delay unit 515 may be implemented using one or more delay cells.

Figure 15:
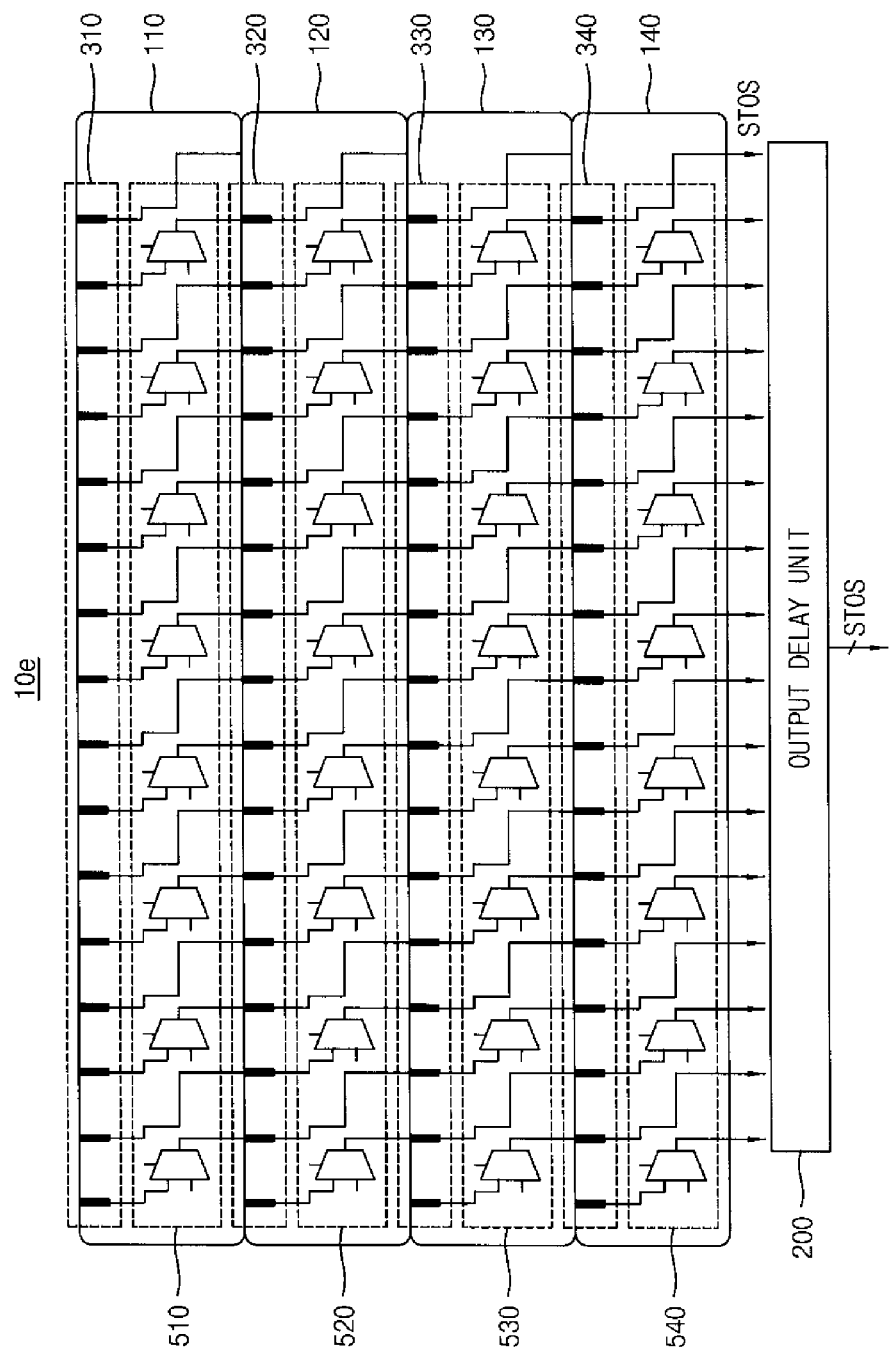
FIG. 15 is a diagram illustrating a stack semiconductor device according to an embodiment.

FIG. 15 is a diagram illustrating still another stack semiconductor device (10e) according to an embodiment of the inventive concept Referring to FIG. 15, the stack semiconductor device 10e is very similar in structure to the stack semiconductor device 10 of FIG. 1, except an output delay unit 200 is provided in addition to substrates 110, 120, 130 and 140, through-silicon-vias 310, 320, 330 and 340 and driving circuits 510, 520, 530 and 540. The output delay unit 200 may be used to control (e.g., delay, synchronize, etc.) possible timing differences among a plurality of output signals (STOS) respectively provided driving circuits of the stack semiconductor device 10e. In this manner, multiple output signals (e.g., output data) may be synchronously and/or collectively (i.e., as a coherent block or stream of data) provided to an external circuit from output delay unit 200 as (e.g.,) serial or parallel data.

Figure 16:
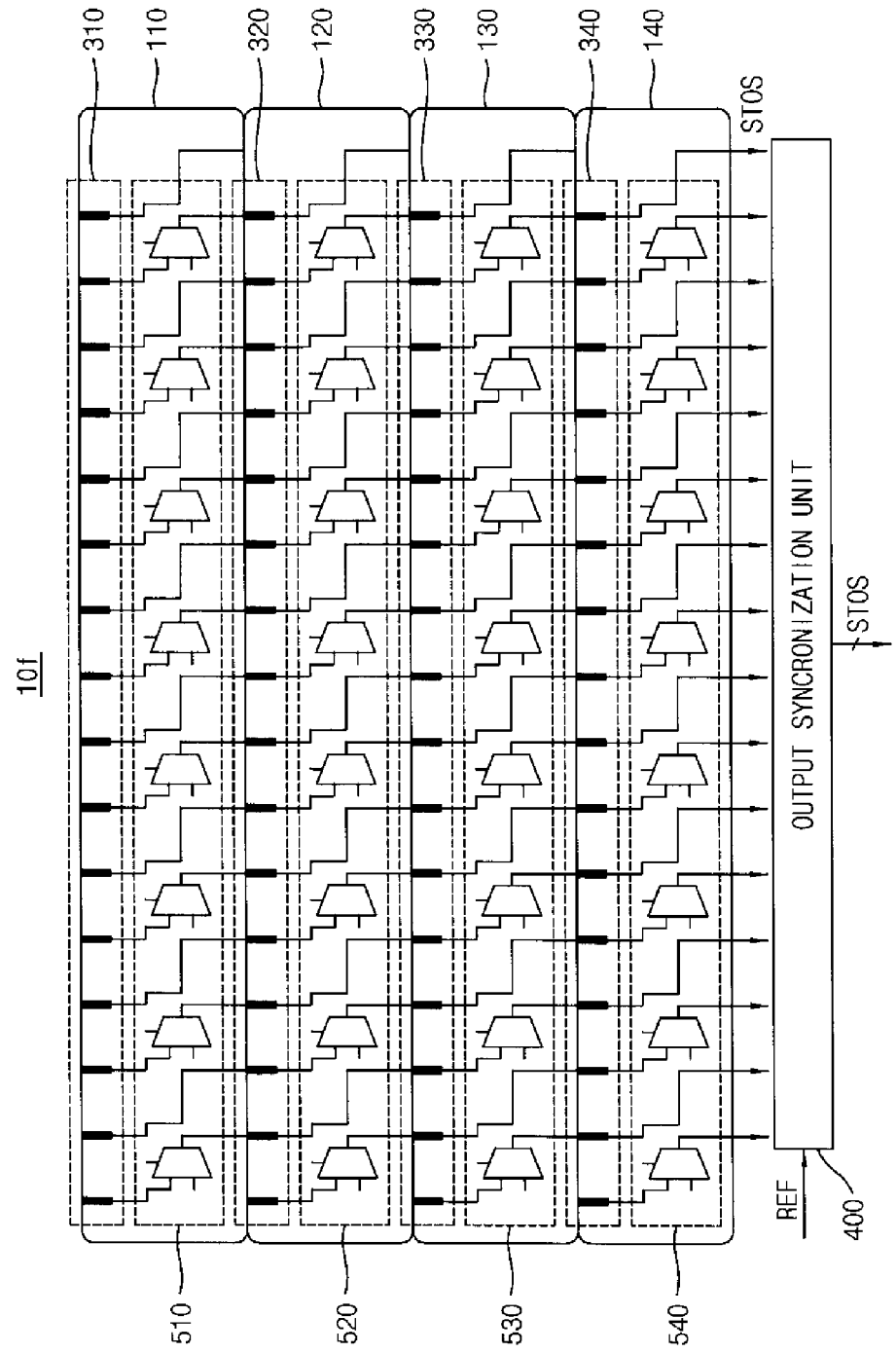
FIG. 16 is a diagram illustrating a stack semiconductor device according to an embodiment.
Figure 17:
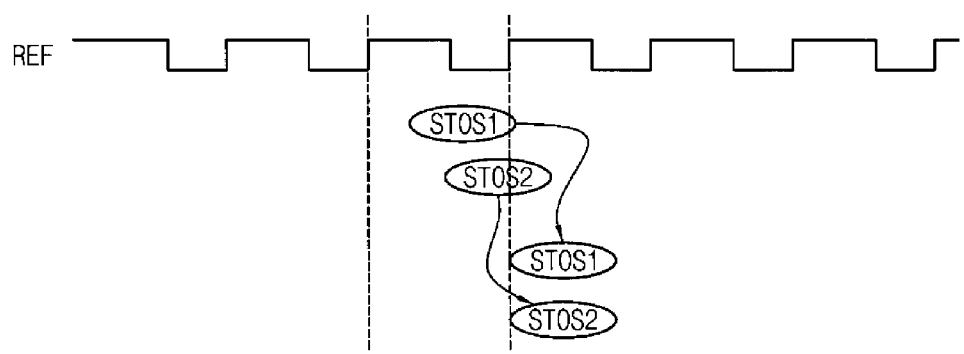
FIG. 17 is a diagram for describing an operation of the stack semiconductor device of FIG. 16.

In this regard, FIG. 16 is a diagram illustrating still another stack semiconductor device (10f) according to an embodiment of the inventive concept. FIG. 17 is a timing diagram further illustrating the operation of the stack semiconductor device 10f of FIG. 16.

Referring to FIGS. 16 and 17, the stack semiconductor device 10f is similarly configured as the stack semiconductor device 10c of FIG. 15. However, the output delay unit 200 of FIG. 15 is specifically replaced by an output synchronization unit 400 in the stack semiconductor device 10f of FIG. 16. Here, the output synchronization unit 400 may be used to synchronize the provision of the plurality of output signals STOS in response to a reference signal REF (e.g., a clock signal). Assuming that the plurality of output signals STOS includes a first output signal STOS1 and a second output signal STOS2 that differently arrive at the output synchronization unit 400 (e.g., relative to a rising or falling edge of the reference signal), the output synchronization unit 400 will variably apply first and second delays to the first and second output signals (STOS1 and STOS2) to synchronize their provision from the output synchronization unit 400 (e.g., at a next rising edge of the reference signal).

Here, the reference signal REF may be variously generated (e.g., in response to a command received from a memory controller, in response to an externally provided or internally generated clock, etc.). Where the first and second output signals are read data, the reference signal REF may be generated in response to a read command received from a memory controller or host.

Figure 18:
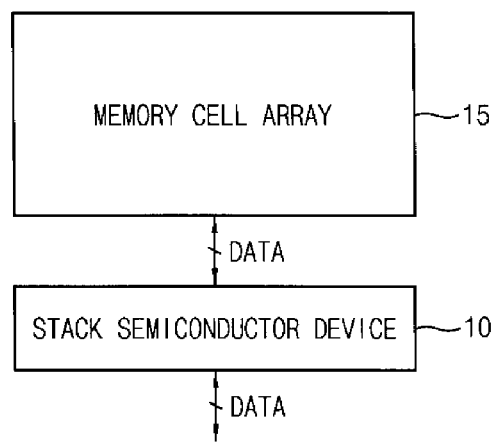
FIG. 18 is a diagram illustrating a memory device according to embodiments.

FIG. 18 is a block diagram illustrating a memory device according to an embodiment of the inventive concept.

Referring to FIGS. 1, 2, 3 and 18, a memory device 20 includes a memory cell array 15 and a stack semiconductor device 10. The memory cell array 15 is configured as conventionally understood to store data. The stack semiconductor device 10 may be used to communicate read data being read from the memory cell array 15 and/or write data being written to the memory cell array 15 (collectively or singularly, DATA).

As has been described in some detail with reference to multiple embodiments, the stack semiconductor device 10 may variously include a plurality of substrates, through-silicon-vias and driving circuits. (See, e.g., FIGS. 1, 2, 3, 7, 8, 9, 10, 11, 12, 13, 15 and 16). The stack semiconductor device 10 may be used to provide asynchronous output data or synchronous output data at multiple output driving circuits disposed in a lowest substrate of the stack semiconductor device 10, or at an output delay/synchronization unit (200, 400) connected to the output driving circuits of a lowest substrate of the stack semiconductor device 10. Alternately or additionally, the stack semiconductor device 10 may be used to receive input data from the memory cell array multiple input driving circuits disposed in a highest substrate of the stack semiconductor device 10.

Figure 19:
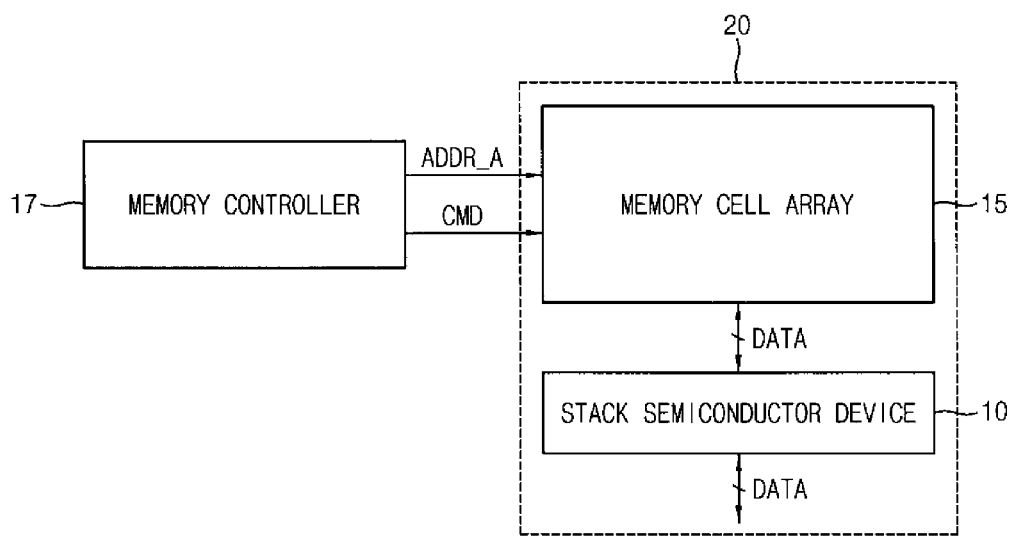
FIG. 19 is a diagram illustrating a memory system according to embodiments.

FIG. 19 is a block diagram illustrating a memory system 30 according to certain embodiments of the inventive concept.

Referring to FIG. 19, the memory system 30 generally includes a memory controller 17 and a memory device 20 like the one described in relation to FIG. 18. The memory controller 17 provides one or more command(s) CMD and address(es) ADDR_A to the memory device 20 to execute a read/write operation. Where a write operation is designated, the memory controller 17 or some other external circuit will provide write data to the memory device 20. The stack semiconductor device 10 may be variously configured from a plurality of substrates, through-silicon-vias and driving circuits, and may be variously controlled by one or more control signals.

In certain embodiments of the inventive concept, the memory cell array 15 will be a three dimensional (3D) memory array. A 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. Examples of 3D memory arrays that may be incorporated as the memory cell array 15 of FIGS. 18 and 19 are set forth in U.S. Pat. Nos. 7,679,133; 8,553,466; 8,654,587; 8,559,235; as well as published U.S. patent application Ser. No. 2011/0233648, the collective subject matter of which is hereby incorporated by reference.

Figure 20:
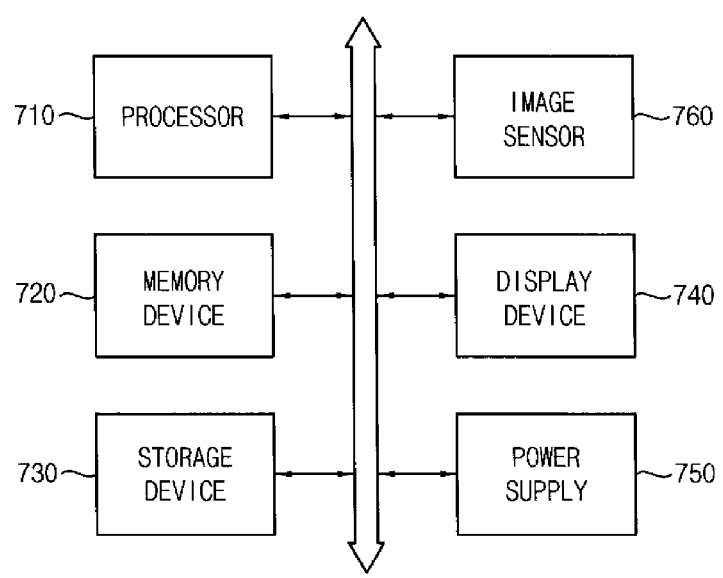
FIG. 20 is a block diagram illustrating a mobile device including the memory module according to embodiments.

FIG. 20 is a block diagram illustrating a mobile device including the memory module according to embodiments.

Referring to FIG. 20, a computing system 700 may include a processor 710, a memory device 720, a storage device 730, a display device 740, a power supply 750 and an image sensor 760. The computing system 700 may further include ports that communicate with a video card, a sound card, a memory card, a USB device, other electronic devices, etc.

The processor 710 may perform various calculations or tasks. According to embodiments, the processor 710 may be a microprocessor or a CPU. The processor 710 may communicate with the memory device 720, the storage device 730, and the display device 740 via an address bus, a control bus, and/or a data bus. In some embodiments, the processor 710 may be coupled to an extended bus, such as a peripheral component interconnection (PCI) bus. The memory device 720 may store data for operating the computing system 700. For example, the memory device 720 may be implemented with a dynamic random access memory (DRAM) device, a mobile DRAM device, a static random access memory (SRAM) device, a phase-change random access memory (PRAM) device, a ferroelectric random access memory (FRAM) device, a resistive random access memory (RRAM) device, and/or a magnetic random access memory (MRAM) device. The memory device 720 includes the data loading circuit according to embodiments. The storage device 730 may include a solid state drive (SSD), a hard disk drive (HDD), a CD-ROM, etc. The computing system 700 may further include an input device such as a touchscreen, a keyboard, a keypad, a mouse, etc., and an output device such as a printer, a display device, etc. The power supply 750 supplies operation voltages for the computing system 700.

The image sensor 760 may communicate with the processor 710 via the buses or other communication links. The image sensor 760 may be integrated with the processor 710 in one chip, or the image sensor 760 and the processor 710 may be implemented as separate chips.

At least a portion of the computing system 700 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP). The computing system 700 may be a digital camera, a mobile phone, a smart phone, a portable multimedia player (PMP), a personal digital assistant (PDA), a computer, etc.

Figure 21:
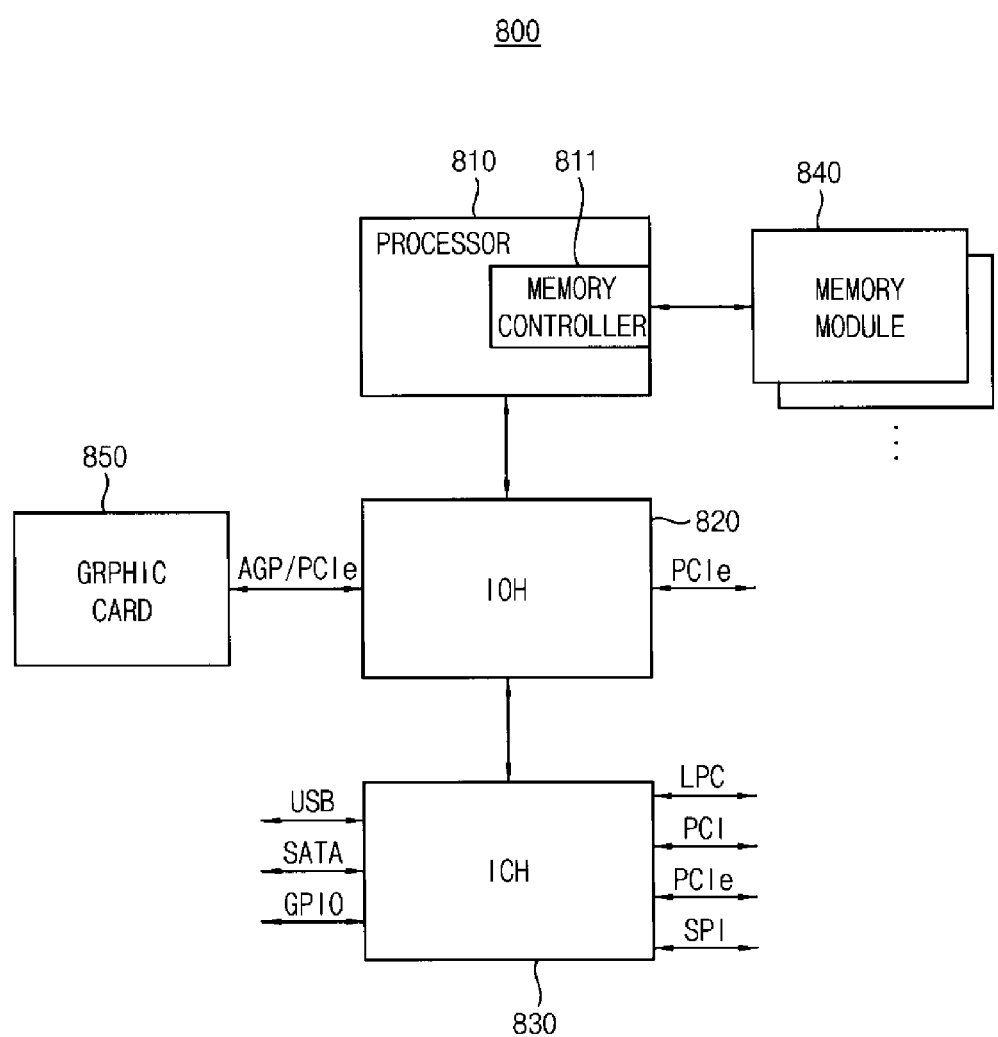
FIG. 21 is a block diagram illustrating a computing system including the memory module according to embodiments.

FIG. 21 is a block diagram illustrating a computing system including the memory module according to embodiments.

Referring to FIG. 21, a computing system 800 includes a processor 810, an input/output hub (IOH) 820, an input/output controller hub (ICH) 830, at least one memory module 840 and a graphics card 850. In some embodiments, the computing system 800 may be a personal computer (PC), a server computer, a workstation, a laptop computer, a mobile phone, a smart phone, a personal digital assistant (PDA), a portable multimedia player (PMP), a digital camera), a digital television, a set-top box, a music player, a portable game console, a navigation system, etc.

The processor 810 may perform various computing functions, such as executing specific software for performing specific calculations or tasks. For example, the processor 810 may be a microprocessor, a central process unit (CPU), a digital signal processor, or the like. In some embodiments, the processor 810 may include a single core or multiple cores. For example, the processor 810 may be a multi-core processor, such as a dual-core processor, a quad-core processor, a hexa-core processor, etc. Although FIG. 21 illustrates the computing system 800 including one processor 810, in some embodiments, the computing system 800 may include a plurality of processors. The processor 810 may include an internal or external cache memory.

The processor 810 may include a memory controller 811 for controlling operations of the memory module 840. The memory controller 811 included in the processor 810 may be referred to as an integrated memory controller (IMC). A memory interface between the memory controller 811 and the memory module 840 may be implemented with a single channel including a plurality of signal lines, or may bay be implemented with multiple channels, to each of which at least one memory module 840 may be coupled. In some embodiments, the memory controller 811 may be located inside the input/output hub 820, which may be referred to as memory controller hub (MCH).

The memory module 840 may include a plurality of memory devices that store data provided from the memory controller 811 and a buffer chip that manages overall operation of the memory devices. Each of the memory devices may store data processed by the CPU 710, or may operate as a working memory. Each of the memory devices may be a dynamic random access memory, such as DDR SDRAM, LPDDR SDRAM, GDDR SDRAM, RDRAM, etc. The buffer chip manages operation of the memory devices.

The input/output hub 820 may manage data transfer between processor 810 and devices, such as the graphics card 850. The input/output hub 820 may be coupled to the processor 810 via various interfaces. For example, the interface between the processor 810 and the input/output hub 820 may be a front side bus (FSB), a system bus, a HyperTransport, a lightning data transport (LDT), a Quick-Path interconnect (QPI), a common system interface (CSI), etc. Although FIG. 21 illustrates the computing system 800 including one input/output hub 820, in some embodiments, the computing system 800 may include a plurality of input/output hubs. The input/output hub 820 may provide various interfaces with the devices. For example, the input/output hub 820 may provide an accelerated graphics port (AGP) interface, a peripheral component interface-express (PCIe), a communications streaming architecture (CSA) interface, etc.

The graphics card 850 may be coupled to the input/output hub 820 via AGP or PCIe. The graphics card 850 may control a display device (not illustrated) for displaying an image. The graphics card 850 may include an internal processor for processing image data and an internal memory device. In some embodiments, the input/output hub 820 may include an internal graphics device along with or instead of the graphics card 850 outside the graphics card 850. The graphics device included in the input/output hub 820 may be referred to as integrated graphics. Further, the input/output hub 820 including the internal memory controller and the internal graphics device may be referred to as a graphics and memory controller hub (GMCH).

The input/output controller hub 830 may perform data buffering and interface arbitration to efficiently operate various system interfaces. The input/output controller hub 830 may be coupled to the input/output hub 820 via an internal bus, such as a direct media interface (DMI), a hub interface, an enterprise Southbridge interface (ESI), PCIe, etc. The input/output controller hub 830 may provide various interfaces with peripheral devices. For example, the input/output controller hub 830 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 810, the input/output hub 820 and the input/output controller hub 830 may be implemented as separate chipsets or separate integrated circuits. In other embodiments, at least two of the processor 810, the input/output hub 820 and the input/output controller hub 830 may be implemented as a single chipset.

The foregoing embodiments are illustrative in nature. Although a few exemplary embodiments have been described, those skilled in the art will readily appreciate that many modifications are possible in the exemplary embodiments without materially departing from the scope of the following claims. Accordingly, many modifications, extensions and adaptations of the foregoing will rightly fall within the scope of the inventive concept, as defined by the claims.

What is claimed is:

1. A stack semiconductor device comprising:
an upper substrate vertically stacked on a lower substrate, the upper substrate including N upper through-silicon vias (UTSV) and upper driving circuits, and the lower substrate including N lower through-silicon vias (LTSV) and lower driving circuits, wherein
each one of the upper driving circuits is directly-electrically connected between a Kth UTSV and a (K+1)th LTSV which are positionally staggered relative to one another in the upper substrate and the lower substrate, respectively, where 'N' is a natural number greater than 1, and 'K' is a natural number ranging from 1 to (N−1).

2. The stack semiconductor device of claim 1, wherein:
the stack semiconductor device includes M vertically stacked substrates, the upper substrate is a highest substrate among the M vertically stacked substrates, and the lower substrate is a next highest substrate, directly disposed under the upper substrate, among the M vertically stacked substrates,
an operating mode of the stack semiconductor device changes in response to a value of M, and
the upper driving circuits are operationally controlled in response to a control signal that varies with the operating mode of the stack semiconductor device.

3. The stack semiconductor device of claim 2, wherein at least one driving circuit of the upper driving circuits and the lower driving circuits is one of an input driving circuit, an output driving circuit, and an input/output (I/O) driving circuit.

4. The stack semiconductor device of claim 3, wherein the at least one driving circuit is an input driving circuit; comprising:
a first input buffer that receives an input signal from a LTSV associated with the at least one driving circuit and passes the input signal to a UTSV associated with the at least one driving circuit in response to a first control signal of the control signal; and
a second input buffer that receives the input signal from the LTSV associated with the at least one driving circuit and passes the input signal to an external circuit in response to a second control signal of the control signal.

5. The stack semiconductor device of claim 3, wherein the at least one driving circuit is an output driving circuit; comprising:
a first output buffer that receives a first output signal from a UTSV associated with the at least one driving circuit and passes the first output signal to a LTSV associated with the at least one driving circuit in response to a third control signal of the control signal; and
a second output buffer that receives a second output signal from an external circuit and passes the second output signal to the LTSV associated with the at least one driving circuit in response to a fourth control signal of the control signal.

6. The stack semiconductor device of claim 5, wherein the output driving circuit further comprises a delay unit disposed between the first and second output buffers and the LTSV associated with the at least one driving circuit.

7. The stack semiconductor device of claim 3, wherein the at least one driving circuit is an I/O driving circuit comprising:
a first input buffer that receives an input signal from a LTSV associated with the at least one driving circuit and passes the input signal to a UTSV associated with the at least one driving circuit in response to a first control signal of the control signal;
a first output buffer that receives a first output signal from the UTSV associated with the at least one driving circuit and passes the first output signal to the LTSV associated with the at least one driving circuit in response to a third control signal of the control signal;

a second input buffer that receives the input signal from the LTSV associated with the at least one driving circuit and passes the input signal to an external circuit in response to a second control signal of the control signal; and a second output buffer that receives a second output signal from an external circuit and passes the second output signal to the LTSV associated with the at least one driving circuit in response to a fourth control signal of the control signal.

8. The stack semiconductor device of claim 3, wherein respective first driving circuits vertically disposed one under another in a first row extending across the M stacked substrates of the stack semiconductor device constitute a first row group that is commonly controlled by at least one control signal of the control signal.

9. The stack semiconductor device of claim 8, wherein each one of the respective first driving circuits in the first row group is an input driving circuit comprising:

a first input buffer that receives an input signal from a LTSV associated with the first driving circuit and passes the input signal to a UTSV associated with the first driving circuit in response to a first control signal of the control signal; and a second input buffer that receives the input signal from the LTSV associated with the first driving circuit and passes the input signal to an external circuit in response to a second control signal of the control signal.

10. The stack semiconductor device of claim 8, wherein each one of the respective first driving circuits in the first row group is an output driving circuit comprising:

a first output buffer that receives a first output signal from a UTSV associated with the first driving circuit and passes the first output signal to a LTSV associated with the first driving circuit in response to a third control signal of the control signal; and a second output buffer that receives a second output signal from an external circuit and passes the second output signal to the LTSV associated with the first driving circuit in response to a fourth control signal of the control signal.

11. The stack semiconductor device of claim 10, wherein the output driving circuit further comprises a delay unit disposed between the first and second output buffers and the LTSV associated with the at least one driving circuit.

12. The stack semiconductor device of claim 8, wherein each one of the respective first driving circuits in the first row group is an I/O driving circuit comprising:

a first input buffer that receives an input signal from a LTSV associated with the first driving circuit and passes the input signal to a UTSV associated with the first driving circuit in response to a first control signal of the control signal;

a first output buffer that receives a first output signal from the UTSV associated with the first driving circuit and passes the first output signal to the LTSV associated with the first driving circuit in response to a third control signal of the control signal;

a second input buffer that receives the input signal from the LTSV associated with the first driving circuit and passes the input signal to an external circuit in response to a second control signal of the control signal; and a second output buffer that receives a second output signal from an external circuit and passes the second output signal to the LTSV associated with the first driving circuit in response to a fourth control signal of the control signal.

13. The stack semiconductor device of claim 1, wherein each one of the upper driving circuits is connected to an odd numbered through-silicon-via (TSV) among the UTSV, and each one of the lower driving circuits is connected to an odd numbered TSV among the LTSV.

14. The stack semiconductor device of claim 1, wherein each one of the upper driving circuits is connected to every fourth one of the UTSV, and each one of the lower driving circuits is connected to every fourth one of the LTSV.

15. The stack semiconductor device of claim 1, wherein the upper driving circuits are operationally controlled in response to a control signal that varies with an operating mode of the stack semiconductor device.

16. A memory device comprising:

a memory cell array configured to store data; and a stack semiconductor device configured to transfer at least one of write data to be written to the memory cell array and read data read from the memory cell array, wherein:

the stack semiconductor device comprises an upper substrate vertically stacked on a lower substrate, the upper substrate including N upper through-silicon vias (UTSV) and upper driving circuits, and the lower substrate including N lower through-silicon vias (LTSV) and lower driving circuits, and each one of the upper driving circuits is directly-electrically connected between a Kth UTSV and a (K+1)th LTSV which are positionally staggered relative to one another in the upper substrate and the lower substrate, respectively, where 'N" is a natural number greater than 1, and 'K' is a natural number ranging from 1 to (N−1).

17. The memory device of claim 16, wherein:

the stack semiconductor device includes M vertically stacked substrates, the upper substrate is a highest substrate among the M vertically stacked substrates, and the lower substrate is a next highest substrate, directly disposed under the upper substrate, among the M vertically stacked substrates, an operating mode of the stack semiconductor device changes in response to a value of M, and the upper driving circuits are operationally controlled in response to a control signal that varies with the operating mode of the stack semiconductor device.

18. The memory device of claim 17, wherein at least one driving circuit of the upper driving circuits and the lower driving circuits is one of an input driving circuit, an output driving circuit, and an input/output (I/O) driving circuit.

19. The memory device of claim 18, wherein respective first driving circuits vertically disposed one under another in a first row extending across the M stacked substrates of the stack semiconductor device constitute a first row group that is commonly controlled by at least one control signal.

20. The memory device of claim 16, wherein the memory cell array is a three-dimensional memory cell array in which word-lines and/or bit-lines are shared between levels.

* * * * *